United States Patent
Tamemoto

(10) Patent No.: US 9,142,712 B2
(45) Date of Patent: Sep. 22, 2015

(54) METHOD FOR MANUFACTURING LIGHT EMITTING ELEMENT

(71) Applicant: NICHIA CORPORATION, Anan-shi, Tokushima (JP)

(72) Inventor: Hiroaki Tamemoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/556,350

(22) Filed: Dec. 1, 2014

(65) Prior Publication Data

US 2015/0155431 A1    Jun. 4, 2015

(30) Foreign Application Priority Data

Dec. 2, 2013 (JP) ................. 2013-249197

(51) Int. Cl.
*H01L 21/00* (2006.01)
*H01L 33/00* (2010.01)
*H01L 33/20* (2010.01)

(52) U.S. Cl.
CPC ........ *H01L 33/0075* (2013.01); *H01L 33/0066* (2013.01); *H01L 33/20* (2013.01)

(58) Field of Classification Search
CPC ......... H01L 33/10; H01L 33/20; H01L 33/24; H01L 2224/00; H01L 2924/00
See application file for complete search history.

(56) References Cited

U.S. PATENT DOCUMENTS

| | | | |
|---|---|---|---|
| 6,870,191 B2 * | 3/2005 | Niki et al. ......... | 257/79 |
| 7,781,790 B2 * | 8/2010 | Minato et al. ......... | 257/98 |
| 8,779,463 B2 * | 7/2014 | Narita et al. ......... | 257/103 |
| 8,847,262 B2 * | 9/2014 | Narita et al. ......... | 257/98 |
| 2008/0303042 A1 | 12/2008 | Minato et al. | |
| 2009/0101936 A1 | 4/2009 | Kamei et al. | |
| 2010/0187542 A1 | 7/2010 | Ichihara et al. | |
| 2010/0187565 A1 | 7/2010 | Kamei et al. | |
| 2010/0237382 A1 | 9/2010 | Kamei | |

(Continued)

FOREIGN PATENT DOCUMENTS

| | | |
|---|---|---|
| JP | 2007-294804 A | 11/2007 |
| JP | 2008-177528 A | 7/2008 |
| JP | 2009-184860 A | 8/2009 |
| JP | 2011-243730 A | 12/2011 |
| JP | 2013-051298 A | 3/2013 |

(Continued)

*Primary Examiner* — Savitr Mulpuri
(74) *Attorney, Agent, or Firm* — Global IP Counselors, LLP

(57) ABSTRACT

A method for manufacturing a light emitting element, including steps of preparing a wafer that has a substrate with a first main face and a second main face, in which the first main face is provided with a plurality of convex components and valleys that connect these convex components, and a semiconductor structure that is provided on the first main face; and dividing the wafer by laser scribing in which a laser beam is emitted from the second main face side along first dividing lines and second dividing lines to obtain a plurality of light emitting elements. The convex components are in the form of pyramids, prisms, or truncated pyramids, each of which having a polyhedral bottom face with a plurality of apexes, edge lines that extend from the apexes, and side faces that link the edge lines to each other. The convex components are disposed regularly so that a plurality of bounded regions, which are regions defined by virtual boundary between side faces of adjacent convex components in the valleys, are present around the convex components. And the first dividing lines and the second dividing lines are lines that extend in a direction that intersects straight lines that link the centers of the plurality of bounded regions around a single convex component.

11 Claims, 9 Drawing Sheets

(56) References Cited

U.S. PATENT DOCUMENTS

2010/0255621 A1 10/2010 Minato et al.
2013/0037825 A1 2/2013 Hiraiwa et al.
2013/0146892 A1 6/2013 Minato et al.
2014/0124805 A1 5/2014 Minato et al.

FOREIGN PATENT DOCUMENTS

| WO | 2009-020033 A1 | 2/2009 |
| WO | 2009-054088 A1 | 4/2009 |
| WO | 2011-145370 A1 | 11/2011 |
| WO | 2013-176089 A1 | 11/2013 |

* cited by examiner

METHOD FOR MANUFACTURING LIGHT EMITTING ELEMENT

CROSS-REFERENCE TO RELATED APPLICATIONS

This application claims priority to Japanese Patent Application No. 2013-249197 filed on Dec. 2, 2013. The entire disclosure of Japanese Patent Application No. 2013-249197 is hereby incorporated herein by reference.

BACKGROUND

1. Technical Field

The present disclosure relates to a method for manufacturing a light emitting element.

2. Related Art

As applications of LED (light emitting diode) elements have expanded in recent years, there has been a need for higher brightness. Accordingly, it has been proposed to provide the surface of a sapphire substrate that comes into contact with a semiconductor layer, with convex components that allow light propagating horizontally through the semiconductor layer to be extracted outside an element (e.g., JP2008-177528A, and JP2012-160502A).

Also, one division method in which individual LED elements are obtained from a wafer is laser scribing (laser dicing), in which a laser beam is focused in the interior or on the surface of the object to be divided (e.g., wafer such as a sapphire substrate), a modified part is formed that will serve as the starting point for division, and a wafer is divided by applying external force to the wafer to create grooves or cracks from the modified part (e.g., JP2008-98465A).

With an LED element such as this, the laser beam used for laser scribing can sometimes damage the semiconductor layer, which degrades the element's characteristics. The effect of laser beam irradiation on the semiconductor layer can be minimized by lowering the laser output or reducing the number of times laser irradiation is performed, but on the other hand, this tends to increase the take time, and diminish the yield, which is attributable to such factors as the locations that remain undivided during wafer dividing, or uneven shape of the element after dividing. Also, the thicker is the wafer, the higher the laser output has to be, or the more times irradiation has to be performed, to divide the wafers, so the risk that the semiconductor layer will be damaged is higher.

SUMMARY

The present disclosure provides a method for manufacturing a light emitting element. The method includes steps of:
preparing a wafer that has a substrate with a first main face and a second main face, in which the first main face is provided with a plurality of convex components and valleys that connect the convex components, and a semiconductor structure that is provided on the first main face; and
dividing the wafer by laser scribing, in which a laser beam is emitted from the second main face side along first dividing lines and second dividing lines, to obtain a plurality of light emitting elements,
the convex components are in the form of pyramids, prisms, or truncated pyramids, each of which having a polyhedral bottom face with a plurality of apexes, edge lines that extend from the apexes, and side faces that link the edge lines to each other,
the convex components are disposed regularly so that a plurality of bounded regions, which are regions defined by the virtual boundary between side faces of adjacent convex components in the valleys, are present around the convex components, and
the first dividing lines and the second dividing lines are lines that extend in a direction that intersects straight lines that link the centers of the plurality of bounded regions around a single convex component.

The present disclosure provides another method for manufacturing a light emitting element. The method includes steps of:
preparing a wafer that has a substrate with a first main face and a second main face, in which the first main face is provided with a plurality of convex components and valleys that connect the convex components, and a semiconductor structure that is provided on the first main face; and
dividing the wafer by laser scribing, in which a laser beam is emitted from the second main face side along first dividing lines and second dividing lines, to obtain a plurality of light emitting elements;
the convex components being in the form of circular cones or truncated circular cones, each of which having a circular bottom face and a side face that is connected to the bottom face,
the convex components are disposed regularly so that a plurality of bounded regions, which are regions defined by the virtual boundary between adjacent convex components in the valleys, are present around the convex components, and a shortest distance between the convex components and the centers of the bounded regions is less than a radius of the bottom faces of the convex components, and
the first dividing lines and the second dividing lines are lines that extend in a direction that intersects straight lines that link the centers of the plurality of bounded regions around a single convex component.

With the method for manufacturing a light emitting element in the present disclosure, continuous damage to the semiconductor layer can be suppressed and the yield can be raised.

DETAILED DESCRIPTION OF THE INVENTION

Figure 1:
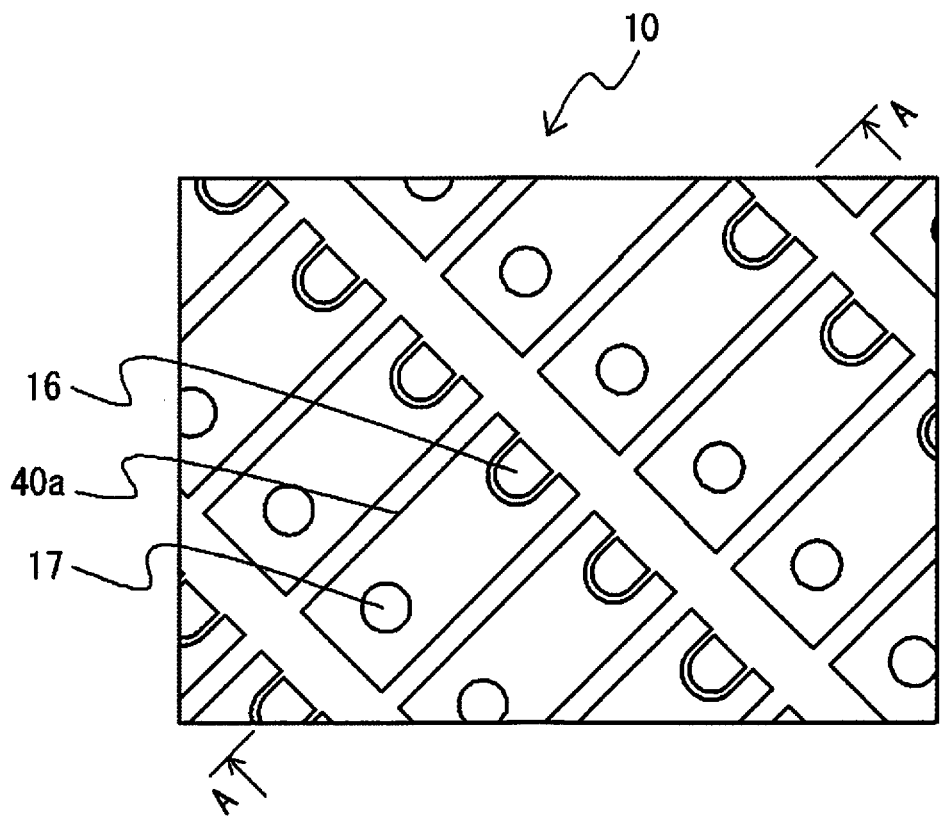
FIG. 1 is a schematic plan view illustrating the step in Embodiment 1.

In the following embodiment, however, a method for manufacturing a light emitting element that embodies the technological concept of the present disclosure are just examples, and unless otherwise specified, the dimensions, materials, shapes, relative layout, and so forth of the constituent parts discussed in the embodiment are not intended to limit the scope of the present disclosure, and are merely examples given for the sake of illustration. Further, constitutions described in examples and the embodiments can be employed in other examples and embodiments. The sizes and the arrangement relationships of the members in each of drawings are occasionally shown exaggerated for ease of explanation. Moreover, in the description below, the same designations or the same reference numerals may, in principle, denote the same or like members and duplicative descriptions will be appropriately omitted.

The method for manufacturing a light emitting element in an embodiment of the present disclosure having a step of preparing a wafer that has a substrate with a first main face and a second main face, in which the first main face is provided with a plurality of convex components and valleys that connect these convex components, and a semiconductor structure that is provided on the first main face; and a step of obtaining a plurality of light emitting elements by dividing the wafer by laser scribing in which a laser beam is emitted from the second main face side along first dividing lines and second dividing lines. The convex components are disposed regularly so that there will be a plurality of bounded regions, which are regions defined by the virtual boundary between adjacent convex components in the valleys, around the convex components, and the first dividing lines and the second dividing lines are lines that extend in a direction that intersects straight lines that link the centers of the plurality of bounded regions around a single convex component. This can reduce damage to the semiconductor structure by laser scribing. Also, continuous damage to the semiconductor layer can be suppressed within a single light emitting element, so the yield can be raised.

Embodiment 1

Wafer Preparation Step

Figure 2:
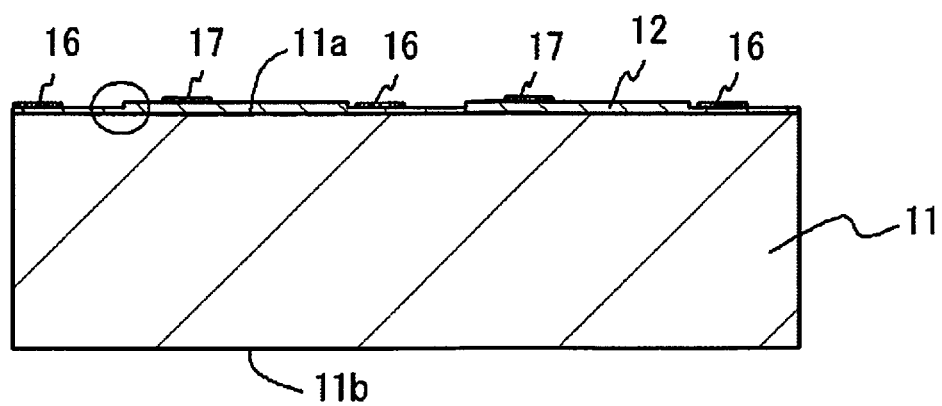
FIG. 2 is a cross sectional view along the A-A line in FIG. 1.
Figure 3:
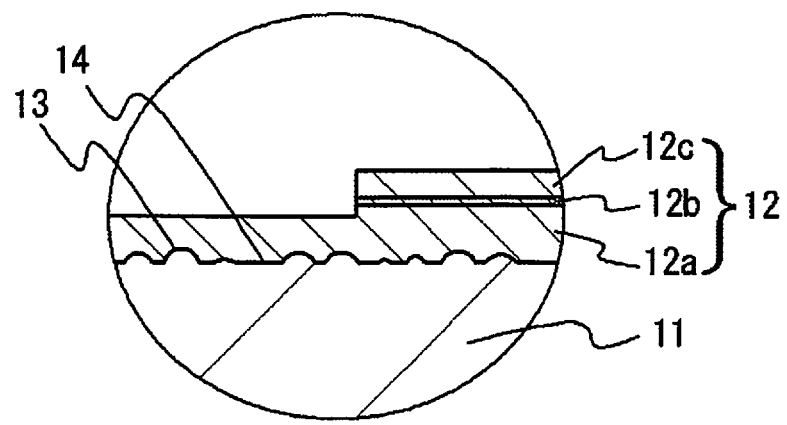
FIG. 3 is a detail view of the circled portion in FIG. 2.

First, as shown in FIGS. 1 to 3, a wafer 10 having a substrate 11 and a semiconductor structure 12 provided on one main face side of the substrate 11 is prepared. FIG. 1 is a schematic plan view illustrating the step in this Embodiment 1, which is a detail view of a portion of the wafer 10. FIG. 2 is a cross sectional view along the A-A line in FIG. 1, and FIG. 3 is a detail view of the circled portion in FIG. 2. As shown in FIGS. 2 and 3, the substrate 11 has a first main face 11a and a second main face 11b, and a plurality of convex components 13 and valleys 14 that connect the convex components 13 are provided to the first main face 11a of the substrate 11. In this embodiment, the dividing lines (discussed below) are shifted from the direction in which the convex components 13 are arranged, so in a cross sectional view along a direction parallel to the dividing lines as in FIG. 3 (a direction parallel to light emitting components 40a of light emitting elements 40), the size and shape of the convex components 13 appear to be uneven.

Figure 4:
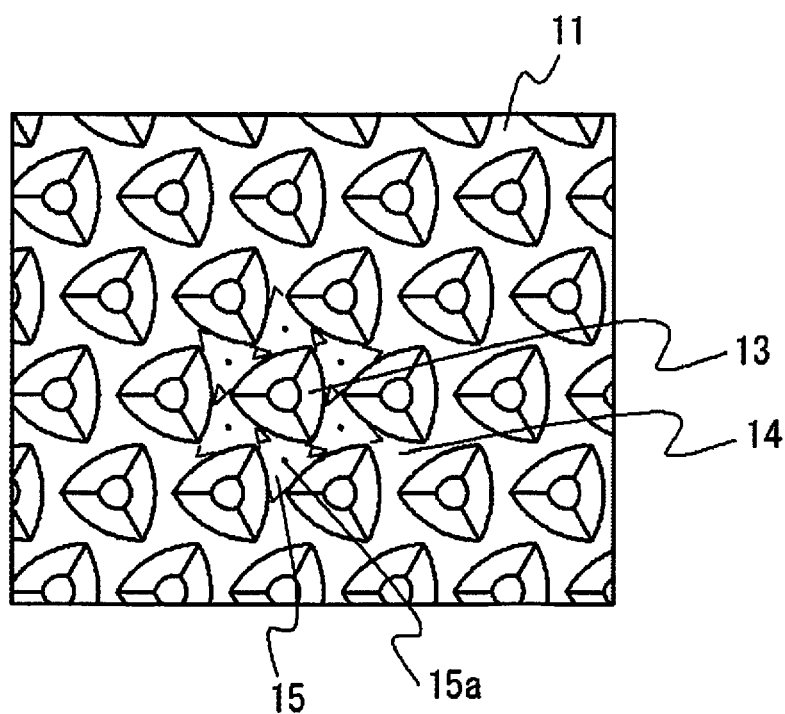
FIG. 4 is a plan view of an example of the layout of the convex components in Embodiment 1.
Figure 5:
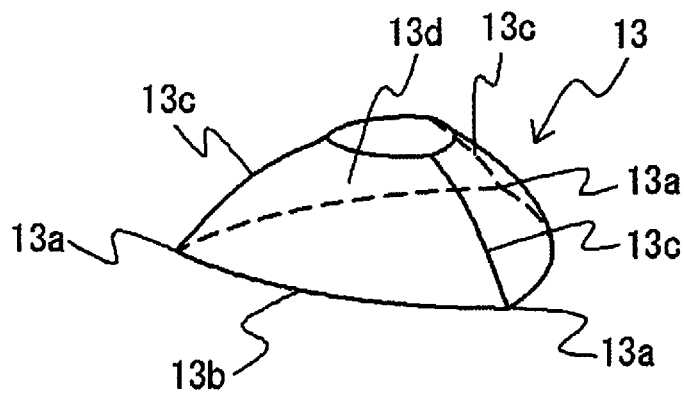
FIG. 5 is an oblique view of an example of the shape of the convex components in Embodiment 1.

As shown in FIG. 4, in this embodiment, all of the convex components 13 are formed in the same size and shape, and they are disposed regularly. FIG. 4 is a detail view of a portion of the first main face 11a of the substrate 11, and is a plan view of an example of the layout of the convex components 13. As shown in FIG. 5, the convex components 13 in this embodiment are in the form of cones, pyramids, prisms, truncated cones or truncated pyramids. FIG. 5 is an oblique view of an example of the shape of the convex components 13 in Embodiment 1. The convex components 13 each have a bottom face 13b with a polyhedral shape having a plurality of apexes 13a, edge lines 13c that extend from the apexes 13a, and side faces 13d that link the edge lines 13c together.

In the valleys 14, there are bounded regions 15 that are regions defined by the virtual boundary between the side faces of adjacent convex components 13, among the plurality of convex components 13. The term "bounded" here means bounded by the side faces of at least three convex components 13. A plurality of the bounded regions 15 are present around the convex components 13. In FIG. 4, the bounded regions 15 are shown as regular triangles, whose center is the center 15a of the bounded regions. The centers 15a of the bounded regions can also be defined as the center in a figure produced by connecting the centers of a plurality of the convex components 13 surrounding the bounded regions 15.

Wafer Division Step

Figure 6:
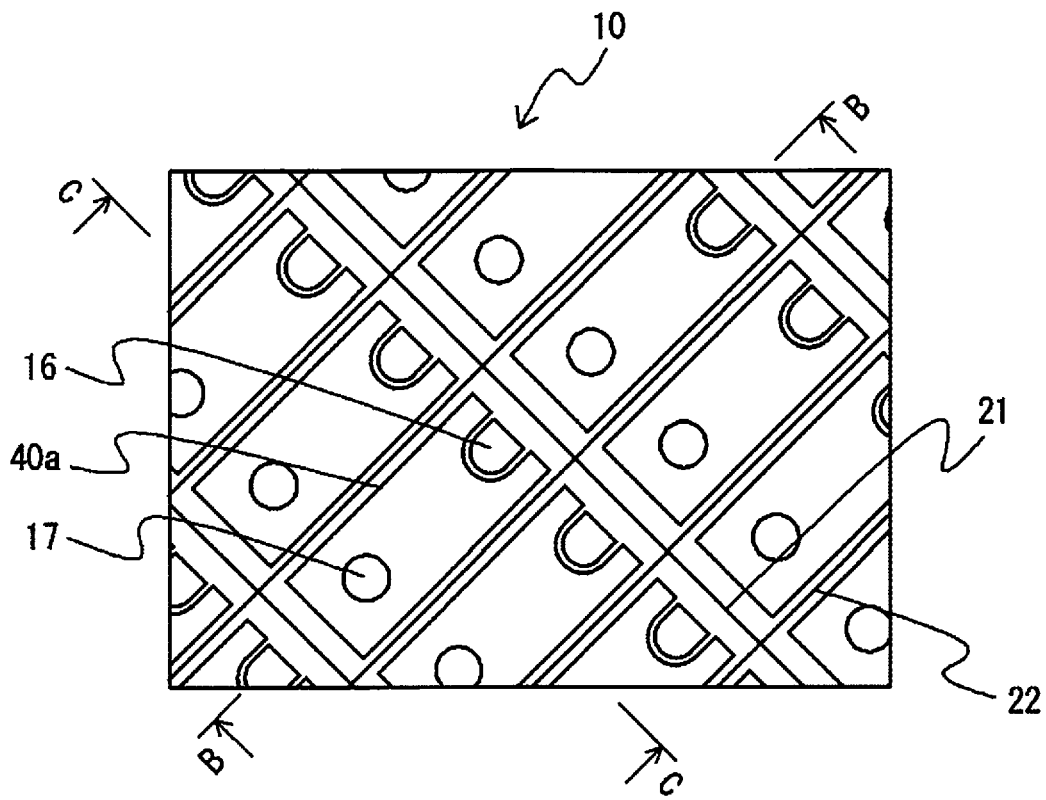
FIG. 6 is a schematic plan view illustrating the step in Embodiment 1.
Figure 7:
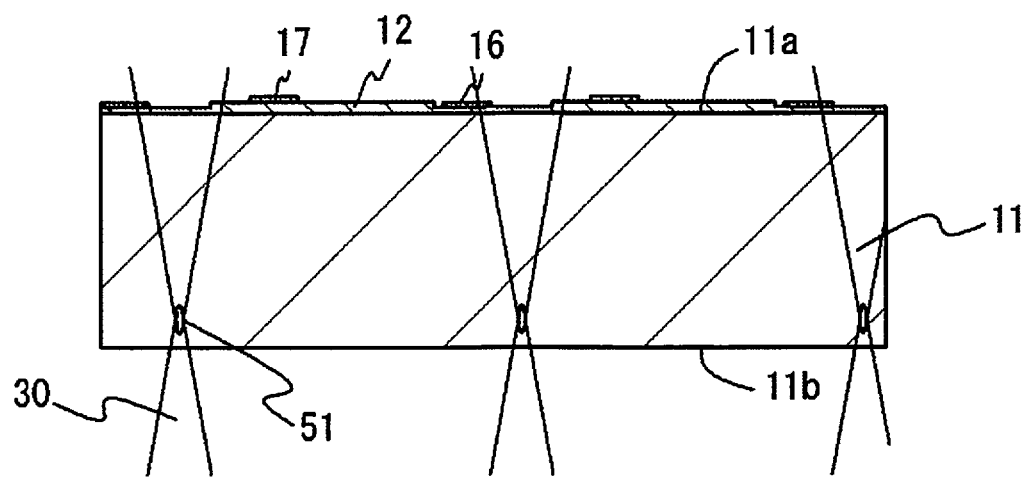
FIG. 7 is a cross sectional view along the B-B line in FIG. 6.
Figure 8:
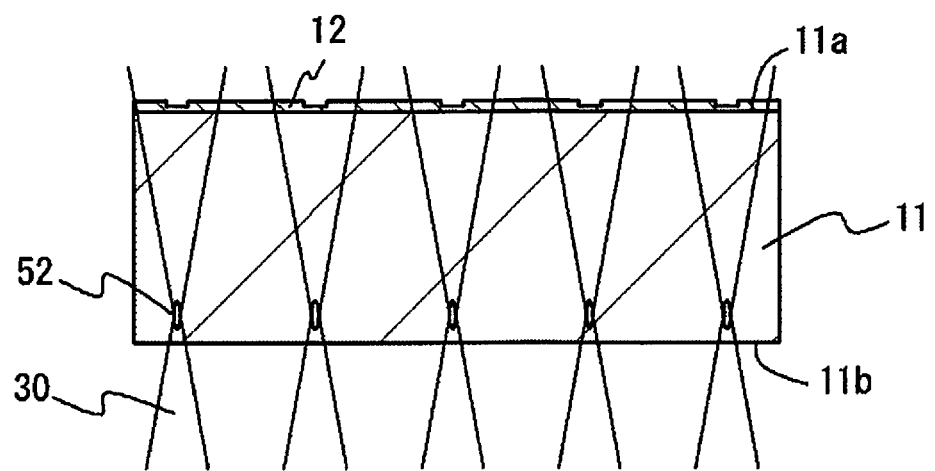
FIG. 8 is a cross sectional view along the C-C line in FIG. 6.
Figure 9:
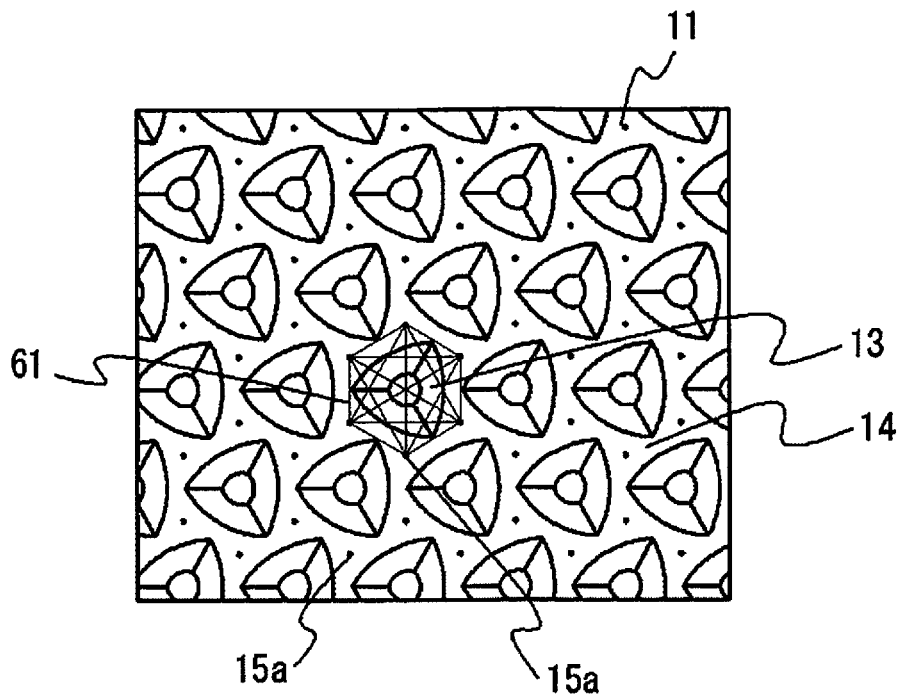
FIG. 9 is a plan view of an example of the layout of the convex components in Embodiment 1.
Figure 10:
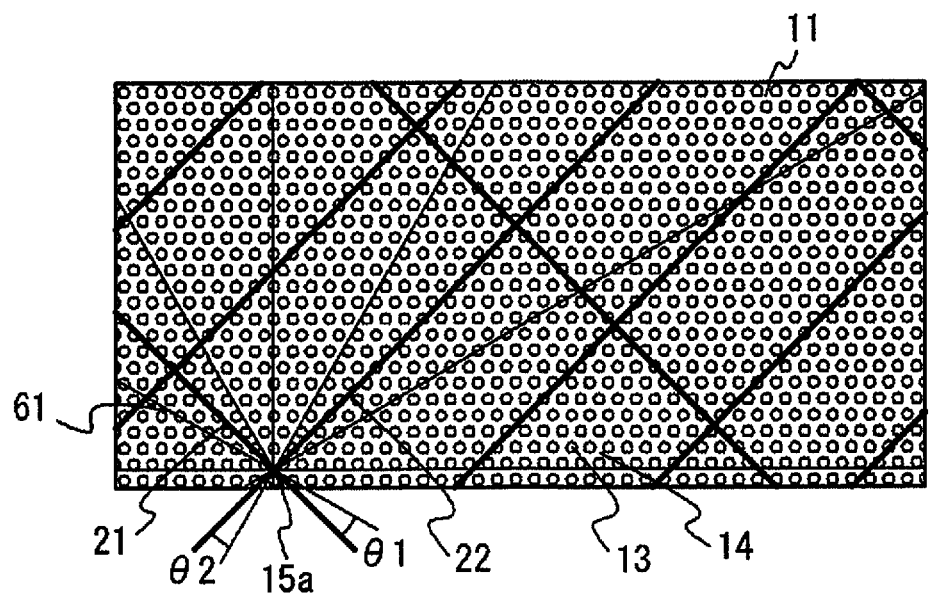
FIG. 10 is a plan view of an example of the relation between the convex components and the first dividing line and second dividing line in Embodiment 1.

As shown in FIGS. 6 to 8, laser scribing is then performed by emitting a laser beam 30 from the second main face 11b side along first dividing lines 21 and second dividing lines 22. This divides the wafer 10 as shown in FIGS. 9 and 10 and gives a plurality of the light emitting elements 40.

FIG. 6 is a schematic plan view illustrating the steps in Embodiment 1, FIG. 7 is a cross sectional view along the B-B line in FIG. 6 and FIG. 8 is a cross sectional view along the C-C line in FIG. 6. As shown in FIG. 7, in laser scribing, the substrate 11 is irradiated with the laser beam 30 along the first dividing lines 21 to form a plurality of first modified parts 51 in the substrate 11, and as shown in FIG. 8, the substrate 11 is irradiated with the laser beam 30 along the second dividing lines 22 to form a plurality of second modified parts 52 in the substrate 11.

The first dividing lines 21 and the second dividing lines 22 are lines that extend in a direction that intersects lines connecting the centers 15a of the plurality of bounded regions 15 around a single convex component 13. FIG. 9 is a plan view of an example of the layout of the convex components 13. As shown in FIG. 9, there are a plurality of centers 15a of bounded regions around a single convex component 13, and these can be connected by straight lines 61. Lines that extend in directions that intersect all of the straight lines 61 are set as the first dividing lines 21 and the second dividing lines 22. An example of this is shown in FIG. 10. FIG. 10 is a plan view of an example of the relationship between the convex components and the first dividing lines and second dividing lines in this Embodiment 1. In FIG. 10, the first dividing lines 21 and the second dividing lines 22 are indicated by thick lines, while the straight lines 61 are indicated by thin lines. In this example, there are six directions in which the straight lines 61 connecting the centers 15a of the bounded regions are extended. In FIG. 10, these six directions are shown as the straight lines 61 that connect the centers 15a of the bounded regions. As shown in FIG. 10, the first dividing lines 21 and the second dividing lines 22 are lines that intersect all of the straight lines 61. In FIG. 10, the positions of the convex components 13 are indicated by circles.

Figure 11:
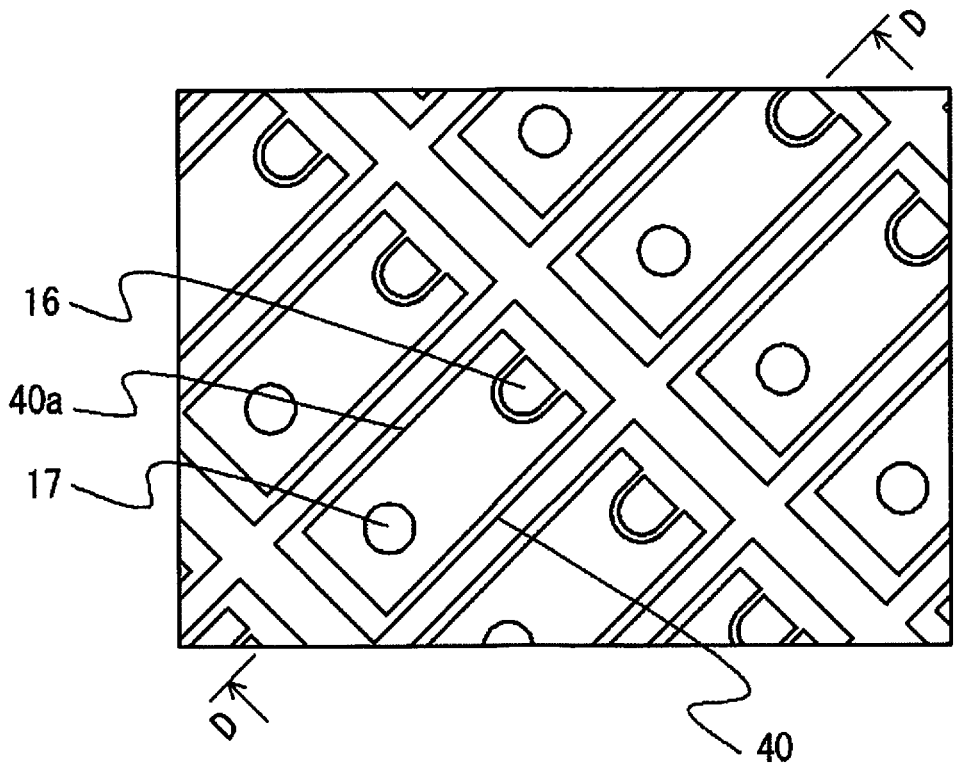
FIG. 11 is a schematic plan view illustrating the step in Embodiment 1.
Figure 12:
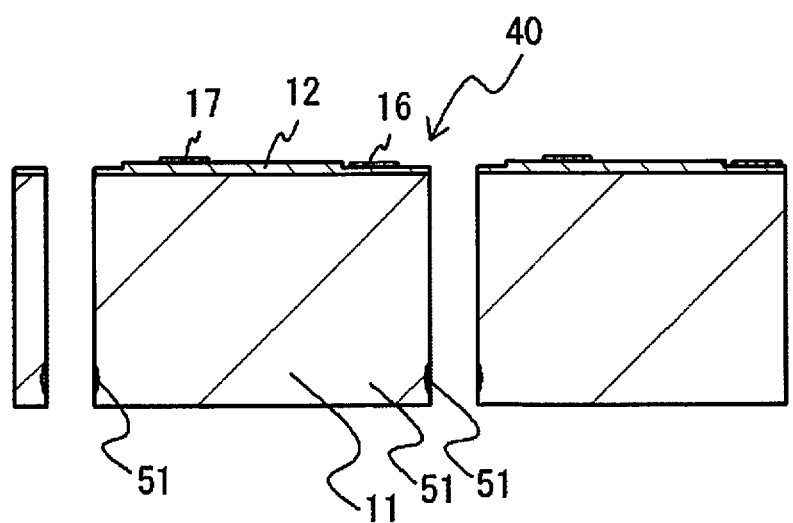
FIG. 12 is a cross sectional view along the D-D line in FIG. 11.

As shown in FIGS. 11 and 12, a plurality of the light emitting elements 40 are obtained by dividing the wafer 10 by laser scribing along the first dividing lines 21 and the second dividing lines 22. FIG. 11 is a schematic plan view illustrating the steps in this Embodiment 1, and FIG. 12 is a cross sectional view along the D-D line in FIG. 11. More specifically, the wafer 10 can be divided by breaking, etc., along the first modified parts 51 and the second modified parts 52. Depending on the thickness of the substrate 11 and the irradiation conditions with the laser beam 30, the substrate 11 will sometimes be completely divided as soon as the first modified parts 51 and/or the second modified parts 52 are formed.

The above method for manufacturing the light emitting elements 40 boosts the yield. This will be discussed in greater detail below.

Figure 13:
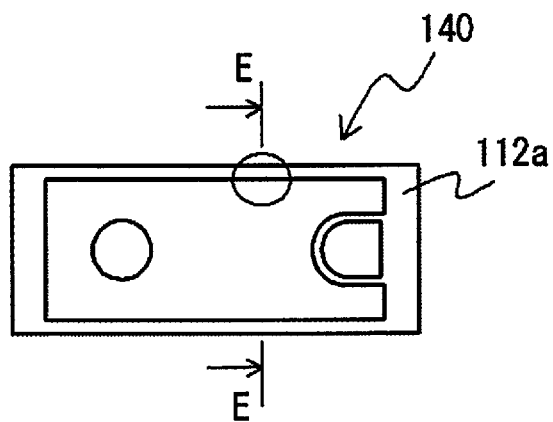
FIG. 13 is a plan view of an example of a conventional structure.
Figure 14:
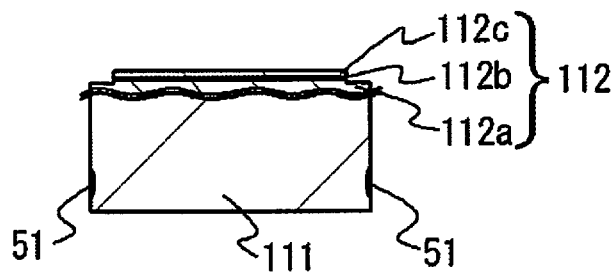
FIG. 14 is a cross sectional view along the E-E line in FIG. 13.
Figure 15:
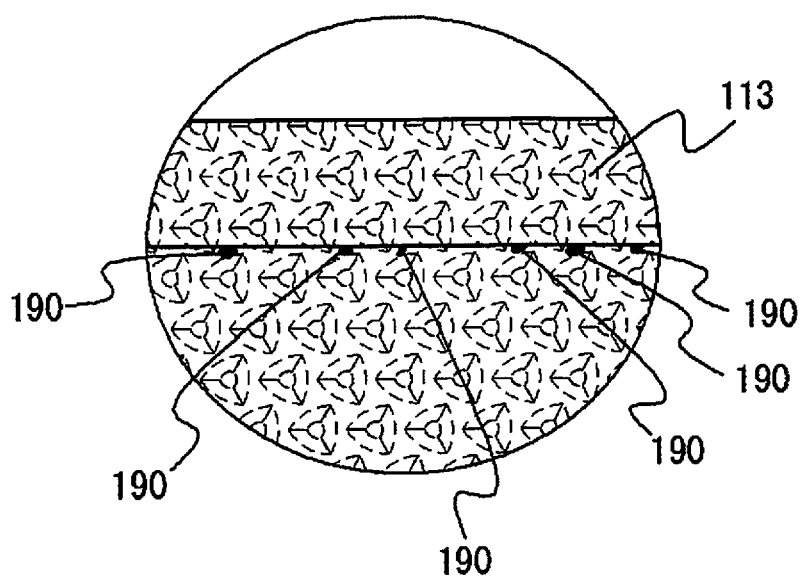
FIG. 15 is a detail view of the circled portion in FIG. 13.

With laser scribing, for example, the laser beam 30 is emitted from the second main face 11b side, which is the opposite side from the first main face 11a where the semiconductor structure 12 is provided. The purpose of this is to avoid damaging the semiconductor structure 12 by irradiation with the laser beam 30. Even with this, however, the ends of the semiconductor structure were sometimes damaged. An example of this is shown in FIGS. 13 to 15. FIG. 13 is a plan view of an example of a conventional structure, FIG. 14 is a cross sectional view along the E-E line in FIG. 13, and FIG. 15 is a detail view of the circled portion in FIG. 13. The conventionally structure light emitting element 140 shown in FIGS. 13 to 15 has a semiconductor structure 112 in which an n-type nitride semiconductor layer 112a, a light emitting layer 112b, and a p-type nitride semiconductor layer 112c are formed in that order, on a substrate 111. The focal position of the laser beam in laser scribing is set to be toward the lower face of the substrate 111, and modified parts 151 are formed at this position. A plurality of convex components 113 are provided in a regular layout on the top face of the substrate 111. The convex components 113 are indicated by broken lines in FIG. 15.

In order to investigate the tendency for the semiconductor structure 112 to be damaged, the inventors used a laser beam to irradiate a wafer under conditions in which damage is likely to occur (high output of the laser beam), and then observed the damaged wafer. As a result, the inventors found that there is regularity between the position of damage and the layout of the convex components 113.

A typical example is shown in FIG. 15. As shown in FIG. 15, markedly numerous damage marks 190 (shown in black) caused by laser scribing occurred when the end face of the semiconductor structure 112 was directly over the portion defined by the virtual boundary between the convex components 113. With the conventionally structured light emitting element 140 in which dividing lines were set along the layout of the convex components 113, the reason why the damage marks 190 occurred continuously is believed to be that the places where the end of the semiconductor structure 112 coincided with the portion defined by the virtual boundary between the convex components 113 were continuous. A damaged light emitting element 140 such as this could lead to leakage, low-voltage breakdown, or the like. In the course of mass production, a reverse current test would detect any elements that exceed a specified value, which are then discarded as defects. The more damaged sites there are, the more reverse current tends to increase. Accordingly, as shown in FIG. 15, if damage occurs numerous times within a single light emitting element 140, there is a very high probability that the product will be defective. As shown in FIG. 14, the end face of the semiconductor structure 112 shown here is the end faces of the light emitting layer 112b and the p-type nitride semiconductor layer 112c. Damage is particularly apt to occur at the p-type nitride semiconductor layer 112c, which contains magnesium. This damage to the semiconductor structure 112 can be confirmed by external observation with an optical microscope, measurement of the photoluminescence (PL) intensity, hot electron emission analysis with an emission microscope, or the like.

The reason why damage is more likely to occur at places where the end face of the semiconductor structure 112 coincides with portions defined by the virtual boundary between the convex components 113 is discussed below.

The laser beam is emitted from the lower face of the substrate 111, and converged on the positions where the modified parts 151 are formed as the focal positions, at which point light is diffused from the focal position toward the semiconductor structure 112 side. The substrate 111 is a sapphire substrate, for example, and light going from the substrate 111 to the semiconductor structure 112 is refracted at the side faces of the convex components 113 due to the refractive index differential between these. Accordingly, light from the substrate 111 tends to concentrate directly over the portions defined by the virtual boundary between the convex components 113. In the laser beam irradiation, the semiconductor structure 112 is affixed to an adhesive sheet or the like, but a gap tends to occur between the end face of the semiconductor structure 112 and an adhesive layer of the sheet. Usually, this gap is about the same as the outside air, but the semiconductor structure 112 and the adhesive layer surrounding the gap have a higher refractive index than that of the gap. It is also possible that light tends to concentrate near the end face of the semiconductor structure 112 because critical angle reflection occurs at the surface of the semiconductor structure 112 and the adhesive layer because of their high refractive index.

Because of the above, when the end face of the semiconductor structure 112 is disposed directly over the portions defined by the virtual boundary between the convex components 113, light will be extremely likely to concentrate near the end face of the semiconductor structure 112, and it is believed that this will tend to cause damage to the semiconductor structure 112. In particular, when the convex components 13 are in the form of cones, pyramids, prisms, truncated cones or truncated pyramids, light will tend to concentrate in the portions defined by the virtual boundary between the side faces 13d since light from the substrate 11 is emitted mainly from the side faces 13d.

In view of this, in this embodiment, as discussed above, the first dividing lines 21 and second dividing lines 22 are set along directions that intersect the straight lines 61 linking the centers 15a of the bounded regions 15 that are defined by the virtual boundary between the convex components 13, so that where the end face of the semiconductor structure 12 coincides with portions surrounded by the convex components 13 will not be continuous. The first dividing lines 21 and second dividing lines 22 are each substantially parallel in most cases to the side faces of the light emitting components 40a, that is, the end face of the semiconductor structure 12. Accordingly, if the laser scribing avoids the direction in which the straight lines 61 connecting the centers 15a of the bounded regions, that is, the direction in which the centers 15a of the bounded regions are continuous in the shortest distance, then the places where the semiconductor structure 12 is prone to damage will not be continuous, and the continuous occurrence of damage can be prevented. Consequently, the probability that the semiconductor structure 12 will be damaged can be reduced, as compared to when there are continuous places where the semiconductor structure 12 is prone to damage, as shown in FIG. 15. Also, even if the semiconductor structure 12 may be damaged, since the damage within a single light emitting element 40 does not occur continuously (that is, since the places where damage occurs are dispersed, rather than being concentrated in a specific region of the wafer), an increase in reverse current in the light emitting elements 40 can be suppressed, and the yield can be higher.

The various members used in the method for manufacturing a light emitting element in Embodiment 1 will now be described in detail. In Embodiment 2 (discussed below), the same members may be used, except for the shape of the convex components.

Substrate 11

The substrate 11 can be a growth substrate that allows the growth of the semiconductor structure 12. If the semiconductor structure 12 is a nitride semiconductor, then the material of the substrate 11 is preferably a hexagonal crystal structure. The problem of light concentrating at specific places due to the convex components 13 is believed to be more likely to happen when the substrate 11 is composed of a different material from that of the semiconductor structure 12. A typical example of a different type of substrate such as this is sapphire. For example, a sapphire substrate whose main face is the C plane is used. In this case, the main face before the formation of the convex components 13 is the C plane, and the C plane appears at a flat face such as the upper faces of the convex components 13 or the bottom faces of the valleys 14 after the formation of the convex components 13.

If the substrate 11 is a sapphire substrate whose main face is the C plane, it is preferable for the convex components 13 to be disposed so that both the first dividing lines 21 and the second dividing lines 22 intersect both the A plane and the M plane of the sapphire substrate. The plane obtained by dividing the substrate 11 will be less likely to be inclined if the plane does not coincide with the A plane and M plane. Setting the angle of the side faces with respect to the main face of the substrate 11 close to vertical allows for a smaller margin (the street width) in dividing, and allows more light emitting elements to be obtained from a single wafer. In this case, the first dividing lines 21 and second dividing lines 22 preferably each have a minimum value for the intersection angle with the A plane and the M plane of at least 1 degree and no more than 15 degrees, respectively. If the minimum intersection angle is set close to 15 degrees, the first dividing lines 21 and second dividing lines 22 can be disposed at a middle position between the A plane and the M plane. Accordingly, even if the actual laser scribing position deviates from the first dividing lines 21 and the second dividing lines 22, the plane obtained by dividing the substrate 11 will be unlikely to coincide with the A plane or the M plane. For example, the minimum intersection angles of the side faces of the light emitting elements 40 with the A plane and with the M plane can be each 10 to 15 degrees. The substrate 11 may have an off-angle to its main face. There are no particular restrictions on the thickness of the substrate 11, but if we take into account the fact that there will be no excessive breakage by irradiation with the laser beam 30, and that the dividing can be carried out reliably, about 40 to 200 μm is preferable. This may be the thickness range in laser scribing, and the above range may be achieved, for example, by thinning the substrate 11 by polishing or the like after the semiconductor structure 12 has been grown.

Semiconductor Structure 12

The semiconductor structure 12 is a nitride semiconductor, for example. In particular, the structure in which a plurality of a semiconductor layers made of $In_XAl_YGa_{1-X-Y}N$ (0≤X, 0≤Y, X+Y≤1) are laminated on the substrate 11 by a metal organic chemical vapor deposition (MOCVD) can be used. As shown in FIGS. 1 to 3, the semiconductor structure 12 can have a first conductivity type semiconductor layer 12a (such as an n-type semiconductor layer), an light emitting layer 12b, and a second conductivity type semiconductor layer 12c (such as a p-type semiconductor layer), in that order starting from the substrate 11 side.

If the substrate 11 has electrical insulation properties, the second conductivity type semiconductor layer 12c and the light emitting layer 12b are removed from a partial region thereof to expose the first conductivity type semiconductor layer 12a, and a first electrode 16 and a second electrode 17 are formed on the first conductivity type semiconductor layer 12a and the second conductivity type semiconductor layer 12c, respectively. The first electrode 16 and the second electrode 17 can be formed from one or more layers of laminated ITO or another such transparent electroconductive oxide, or W, Al, Ti, Cr, Rh, Pt, Au, Ni or another such metal, or an alloy thereof. A protective film such as $SiO_2$ may be provided to cover the surface of the semiconductor structure 12 and/or these electrodes 16 and 17. The semiconductor structure 12 is usually thinner than the substrate 11, with a thickness of about 3 to 20 μm, for example.

The first dividing lines 21 and the second dividing lines 22 can usually be set as lines that pass through only the region other than the light emitting components 40a, that is, the region where the light emitting layer 12b is not present, in order to avoid damage during dividing into individual units. This region is, for example, the region where the substrate 11 is exposed or the region where the first conductivity type semiconductor layer 12a is exposed.

Convex Components 13

The convex components 13 are provided to the surface of the substrate 11. The convex components 13 change the propagation direction of part of the light propagating through the semiconductor structure 12 by reflecting this light at the surface of the convex components 13, and this improves the light extraction efficiency. The convex components 13 can be formed by removing part of the surface of the substrate 11. More specifically, an example is a method in which a mask pattern of a suitable shape is used to remove everything but the portion that will become the convex components, by dry etching, wet etching, or other such etching. For example, if a mask with a polyhedral shape is used to perform wet etching, the portions corresponding to the edges of the polyhedrons will have a shape that curves outward, so a shape that is approximately polyhedral can be easily formed.

As shown in FIG. 4, the convex components 13 are disposed at positions corresponding to the various points of a triangle lattice, for example. In a triangle lattice, triangles are arranged two-dimensionally. The lattice lines of the triangle are lines that connect adjacent lattice points, and are lines that constitute the edges of the unit lattices. In the example shown in FIG. 4, the triangular lattice is a regular triangular lattice. The light extraction efficiency can be further improved by convex components 13 arranged in this way. The valleys 14 that link the convex components 13 are preferably flat faces.

The plan view shape of the convex components 13 (equivalent to the shape of bottom faces 13b) is preferably polyhedral, or an approximately polyhedral shape in which the edges of the polyhedron are replaced with curved lines. The plan view shape of the convex components 13 shown in FIG. 4 is a shape that approximates regular triangles, in which the edges of the regular triangles have been replaced with curved lines. The triangular or similarly shaped convex components 13 are easy to arrange at high density in the above-mentioned triangle lattice layout, so it is preferable in terms of increasing the light extraction efficiency. The convex components 13 may all be disposed in the same orientation. Also, if convex components 13 that are adjacent at the shortest distance are arranged, in plan view, so that the side face 13d of one convex component 13 is located along an extension of the edge line 13c of another convex component 13, it will be easier to achieve a high-density layout. As shown in FIG. 4, for example, if the plan view shape of the convex components 13 is triangular or approximately triangular, the apex 13a of one of the convex components 13 may be arranged so as to be opposite the side face 13d of the adjacent convex component 13.

The shape of the bottom faces 13b of the convex components 13 is preferably triangular, square, or hexagonal. The shapes mentioned here include similar shapes in which the edges of the triangles, etc., are replaced with curved lines. If the bottom faces 13b are triangular, the convex components 13 will be in the form of triangular prisms or truncated triangular prisms. The phrase "in the form of triangular prisms or truncated triangular prisms" here encompasses shapes similar to triangular prisms or truncated triangular prisms. For example, a shape in which the faces or edges of triangular prisms or truncated triangular prisms have been replaced with curved surfaces, a shape in which the slope angle of the side faces 13d changes midway, or the like can be employed. The shape of the poly-sided prisms or truncated poly-sided prisms is one at least having the edge lines 13c. For example, a shape of a triangular prism or a truncated triangular prism has three edge lines on the sides. The edge lines 13c are not limited to being straight lines, and may instead be curved lines.

It is preferable for the side faces 13d of the convex components 13 to be flat faces. If the side faces 13d are smooth faces within no bumps, light from the substrate 11 will tend not to be scattered as it moves to the semiconductor structure 12, making it likely that the light will be concentrated at the designated place. The side faces 13d may be smooth enough that no bumps are observed in an SEM image taken at a magnification of 10,000, for example. Also, in the case of polygonal prisms or truncated polygonal prisms, the side faces 13d are preferably flat enough that at least the edge lines 13c can be discerned.

Figure 16:
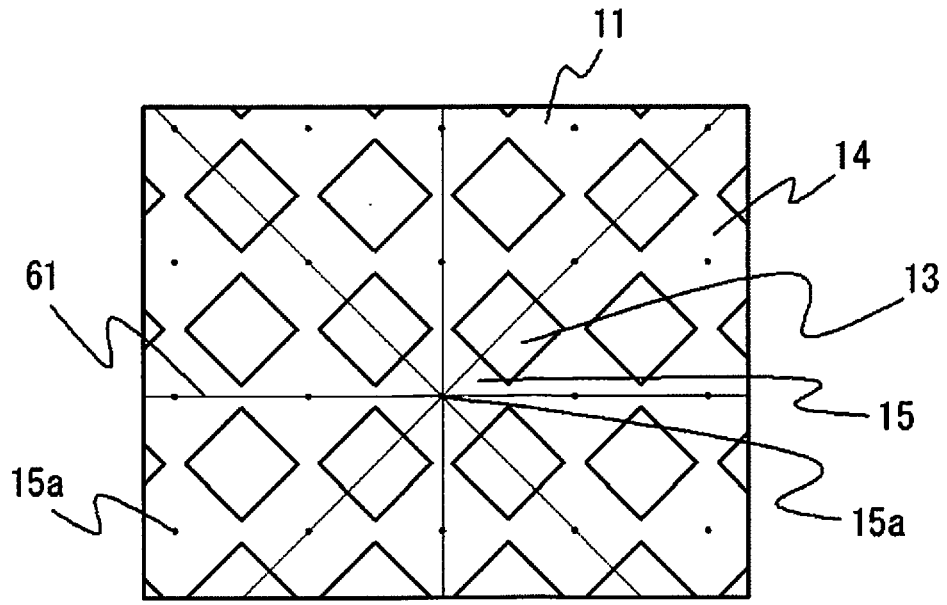
FIG. 16 is a plan view of modification example 1 of the convex components.
Figure 17:
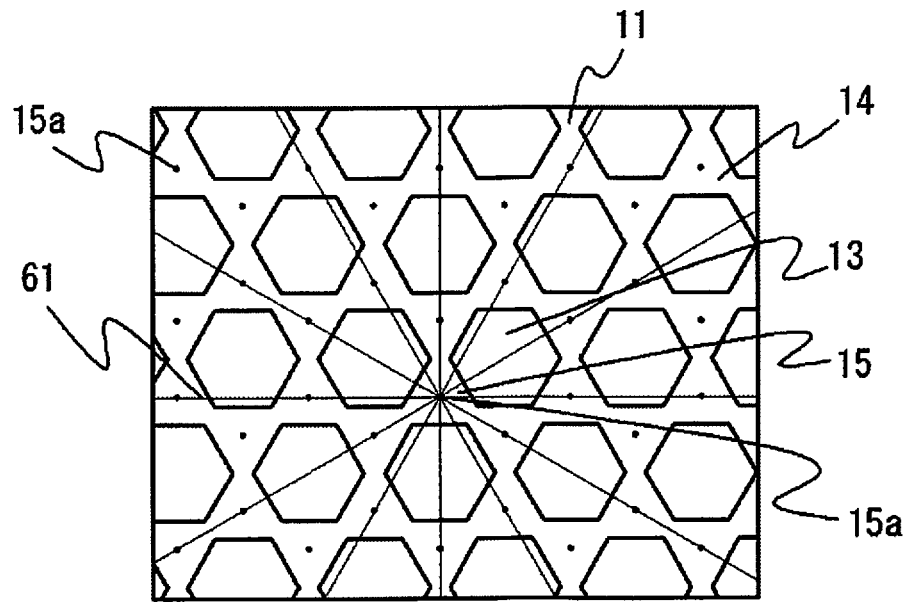
FIG. 17 is a plan view of modification example 2 of the convex components.

FIGS. 16 and 17 show other examples of the shape of the convex components 13. The convex components 13 can be in the form of cones or truncated cones whose bottom face has the shape shown in FIG. 16 or 17. FIG. 16 is a plan view of a Modification Example 1 of the convex components 13, in which the plan view shape of the convex components 13 (the shape of the bottom faces) is square. As shown in FIG. 16, when the convex components 13 are square, they can be arranged in a square lattice pattern. In this case, the bounded regions 15 are each a region defined by the virtual boundary between the side faces of four convex components 13, and the straight lines 61 that connect the centers 15a thereof extend in four directions. With a layout in the form of a square lattice, the distance between the side faces of the convex components 13 and the centers 15a of the bounded regions is relatively large, but on the other hand there can be more side faces of the convex components 13 that are opposite a single bounded region 15.

FIG. 17 is a plan view of a Modification Example 2 of the convex components 13, in which the plan view shape of the convex components 13 is regular hexagonal. In this example, the convex components 13 are arranged in a regular triangle lattice pattern, and the bounded regions 15 are the regions defined by the virtual boundary between the side faces of three convex components 13. The straight lines 61 that connect the centers 15a of the bounded regions extend in six directions. When the number of side faces constituting a single convex component 13 increases, the strength of the light emitted from a single side face is relatively decreased, so the number of side faces of a single convex component 13 is preferably no more than 10, and more preferably no more than six. For example, the shape of the bottom faces 13b may be a polyhedral shape or approximately polyhedral shape with no more than 10 or no more than six corners.

When the convex components 13 are disposed at high density, the light extraction efficiency does improve, but the light intensity is higher when the laser beam 30 is concentrated in the bounded regions 15, which makes the semiconductor structure 12 more susceptible to damage. With the manufacturing method in this embodiment, however, damage to the semiconductor structure 12 will cause less of a decrease in the yield, so a good yield can be maintained while the light extraction efficiency of the light emitting elements 40 can be improved. From the standpoint of a good balance between high-density layout and ease of manufacturing, an example of the shortest distance between the convex components 13 (the width of the places where the valleys 14 are narrowest) is preferably about 0.2 to 5 μm, and more preferably about 0.2 to 1 μm. An example of the shortest distance between the convex components 13 and the centers 15a of the bounded regions is preferably about 10 μm or less, and more preferably about 0.2 to 10 μm. The shortest distance between the convex components 13 and the centers 15a of the bounded regions can be shorter than the distance from the center of the convex components 13 to the side faces 13d on a straight line connecting the centers 15a of the bounded regions and the center of the convex components 13 in plan view.

As shown in FIG. 10, a first angle θ1, which is the smallest intersection angle of the angles at which the first dividing lines 21 intersect the straight lines 61 connecting the centers of the bounded regions 15, and a second angle θ2, which is the smallest intersection angle of the angles at which the second dividing lines 22 intersect the straight lines 61, are both greater than zero. When deviation during manufacture is taken into account, the first angle θ1 and the second angle θ2 are preferably at least one degree. That is, the first dividing lines 21 and the second dividing lines 22 are preferably lines extending in a direction that intersects by at least one degree with the straight lines 61 that connect the centers 15a of the bounded regions around a single convex component 13. The intersection angle is more preferably at least three degrees.

The first dividing lines 21 and second dividing lines 22 are preferably disposed near the middle between adjacent straight lines 61. That is, each of the first dividing lines 21 and second dividing lines 22 is preferably either extending in the same direction as a middle line that passes through the middle of two adjacent straight lines out of the straight lines 61 that connect the centers 15a of the bounded region present around a single convex component 13, or extending in a direction that intersects this middle line by no more than five degrees. In the example shown in FIG. 10, the straight lines 61 are sloped by 30 degrees each, so if the angles θ1 and θ2 formed by the straight lines 61 and the first dividing lines 21 and second dividing lines 22 are both set to 15 degrees, the first dividing lines 21 and second dividing lines 22 can be disposed in a middle position between the straight lines 61. Accordingly, even if the actual laser scribing position deviates from the first dividing lines 21 or the second dividing lines 22, it will tend not to coincide with the straight lines 61. In this case, for example, the smallest intersection angle of the straight lines 61 with the laser scribing lines produced when the laser beam is emitted in a broken line pattern will be about seven to 15 degrees.

The size of the bottom face of the convex components 13, such as the longest distance between any apexes 13a or the distance of a line connecting adjacent apexes 13a, is about 0.1 to 5 μm. The angle formed by the bottom faces 13b and the side faces 13d is preferably about 30 to 80 degrees, and more preferably about 40 to 70 degrees. Because the side faces 13d are sloped, the propagation direction of light propagating through the semiconductor structure 12 tends to change to the surface side of the semiconductor structure 12, which further improves the light extraction efficiency. On the other hand, if the side faces 13d are sloped, light from the substrate 11 will concentrate in portions that are susceptible to damage by the laser beam 30, such as the light emitting layer 12b and the second conductivity type semiconductor layer 12c, more readily than if these faces were vertical. With the manufacturing method in this embodiment, however, the light extraction efficiency can be improved while suppressing a decrease in the yield caused by damage. Also, the faces that make up the cones or truncated cones may be curved surfaces. For example, the convex components 13 shown in FIG. 5 are in the form of truncated triangular prisms in which the side faces are constituted by curved surfaces, the lower bottom and upper bottom thereof are approximately triangular in shape, and the upper bottom is closer to a circle, with a larger radius of curvature, than the lower bottom.

It is suitable for the height of the convex components 13 to be, for example, about 0.2 μm or more and no more than the total thickness of the semiconductor structure 12 provided on the substrate 11. It is also suitable for it to be less than the thickness of the first conductivity type semiconductor layer 12a. If λ is the emission wavelength of the light emitting elements 40, the height is preferably at least λ/4. Light can be effectively scattered or refracted, and the flow of current in the lateral direction of the semiconductor structure 12 can be maintained at a good level, allowing good emission efficiency to be ensured.

First Dividing Lines 21 and Second Dividing Lines 22

As shown in FIG. 6, the first dividing lines 21 can be lines arranged parallel to each other and at a specific spacing, and the second dividing lines 22 can be lines arranged parallel to each other and at a specific spacing. The first dividing lines 21 can intersect the second dividing lines 22. If rectangular light emitting elements 40 are to be obtained, then the first dividing lines 21 can be perpendicular to the second dividing lines 22. For example, if rectangular light emitting elements 40 are to be obtained, the spacing at which the first dividing lines 21 are arranged and the spacing at which the second dividing lines 22 are arranged are made different from each other, but if square light emitting elements 40a are to be obtained, the spacings are made the same.

Laser Beam 30

The laser beam 30 that forms the first modified parts 51 and the second modified parts 52 on the substrate 11 is one whose wavelength can be transmitted through the substrate 11. For example, if the substrate 11 is a sapphire substrate, then a laser beam with a peak wavelength of 250 to 1100 nm can be used. In one embodiment, a laser scribing can be performed with a laser beam 30 with a peak wavelength of about 1000 to 1100 nm. The same irradiation conditions and so forth for the laser beam 30 can be used in forming the first modified parts 51 and the second modified parts 52. The laser beam 30 that forms the first modified parts 51 and the second modified parts 52 preferably has a pulse width of at least 100 femtoseconds and no more than 500 nanoseconds, and more preferably no more than 10 picoseconds. When the modified parts 51 and 52 are formed by multi-photon absorption, cracks will tend to spread out from the processed part produced at the focal position of the laser beam 30, making it easier to divide the wafer precisely. Also, since the substrate 11 will not be discolored if the processing is done by multi-photon absorption, this prevents a decrease in the output of the light emitting elements due to the absorption of light at the discolored parts. The pulse energy of the laser beam can be about 0.5 to 10 μJ.

The focal position of the laser beam is preferably closer to the inside of the substrate 11 than the second main face 11b, and is preferably set to a position that is closer to the second main face 11b than the first main face 11a. For example, it can be set so that the focal point is located, at a spot diameter of 10 μm or less, at a position about 5 to 50 μm to the inside from the second main face 11b. The laser beam 30 is scanned so that this focal position overlaps the first dividing lines 21 and the second dividing lines 22 in plan view. The beam may be scanned a plurality of times, changing the focal depth on the same dividing line. In this case, however, it is extremely difficult to emit the laser so that the plurality of dividing origins (laser focal positions) completely coincide when seen in plan view, and the dividing plane will be discontinuous, corresponding to the dividing origins. Thus, it is preferable for the irradiation conditions to be sufficient to generate enough cracks to allow for division in a single scan.

The laser beam 30 in FIG. 7, etc., is a schematic example of the optical path of the laser beam 30, and the laser beam 30 in this embodiment is not limited to this. For instance, if a femtosecond laser is concentrated in the interior of a transparent material, it is believed that a phenomenon called self-trapped filamentation may occur, in which the beam propagates at a constant beam diameter for a short distance after the concentration location.

Light Emitting Elements 40

The external shape of the light emitting elements 40 is usually substantially cuboid, in which case the plan view shape is substantially square, substantially rectangular, etc. For instance, in the example shown in FIGS. 11 and 12, the light emitting elements 40 are substantially cuboid, in which the plan view shape thereof is rectangular. If the plan view shape of the light emitting elements 40 is a shape that includes long sides and short sides, such as in a rectangular shape, then even if the short sides may coincide with the direction in which the centers 15a of the bounded regions are continuous, so that damage to the semiconductor structure 12 is continuous, there will be relatively little increase in reverse current since the proportion of the light emitting elements 40 accounted for by the short sides is small. Because of this, just the dividing lines forming the long sides can be shifted from the direction in which the centers 15a of the bounded regions are continuous. Preferably, though, laser scribing will be performed in which the dividing lines forming all of the sides of the light emitting elements 40 are shifted from the direction in which the centers 15a of the bounded regions are continuous as discussed above.

Embodiment 2

Figure 18:
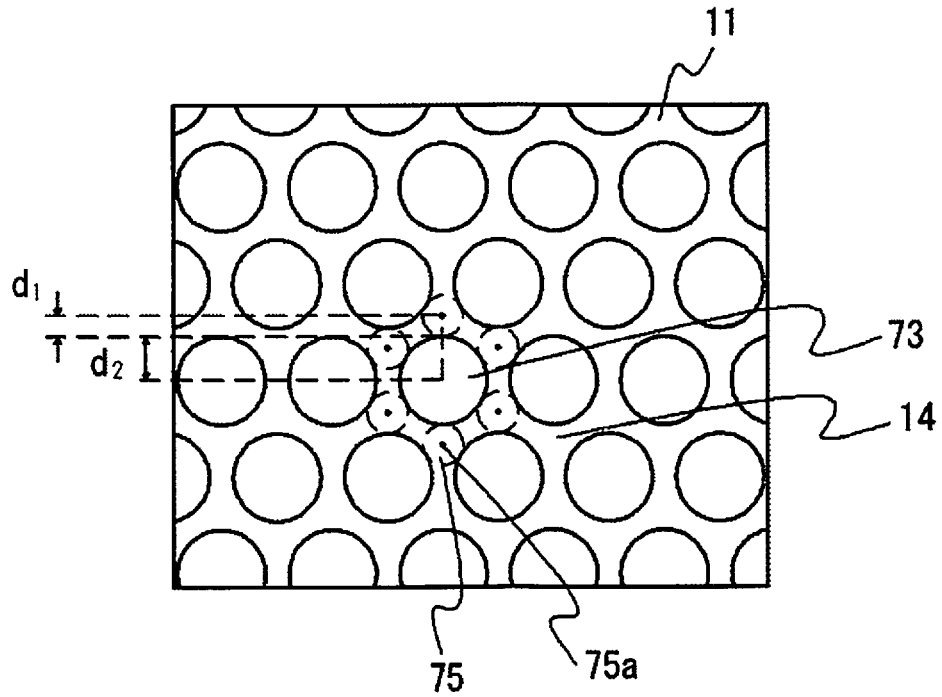
FIG. 18 is a plan view of an example of the layout of the convex components in Embodiment 2.

The method for manufacturing a light emitting element of Embodiment 2 will now be described through reference to FIGS. 18 and 19. Everything is the same in Embodiment 2 as in Embodiment 1 except for the shape of convex components 73.

Wafer Preparation Step

As is the case with Embodiment 1, a wafer 10 having a substrate 11 and a semiconductor structure 12 provided on one main face side of the substrate 11 is prepared. The substrate 11 has a first main face 11a and a second main face 11b, and valleys 14 that connect a plurality of convex components 73 together are provided to the first main face 11a of the substrate 11 as shown in FIG. 18. FIG. 18 is a plan view of an example of the layout of the convex components 73, and is a diagram in which part of the first main face 11a of the substrate 11 in Embodiment 2 is shown enlarged.

The convex components 73 in Embodiment 2 are in the form of cones or truncated cones, and each have a circular bottom face and side faces that are connected to the bottom face. As shown in FIG. 18, in this embodiment, all of the convex components 73 are formed in the same size and shape, and are arranged in a regular pattern. In the valleys 14 there are bounded regions 75, which are regions that are each defined by the virtual boundary between adjacent convex components 73, among the plurality of convex components 73. The term "bounded" here means that a valley is bounded by at least three convex components 73. A plurality of the bounded regions 75 are present around the convex components 73. The shortest distance $d_1$ between a convex component 73 and the centers 75a of the bounded regions is shorter than the radius $d_2$ of the bottom face of the convex component 75. In FIG. 18, an example is given in which the bounded regions 75 are depicted as being circular, and the center of each circle is the center 75a of a bounded region, but the centers 75a of the bounded regions can also be defined as the center of a figure produced by connecting the centers of a plurality of convex components 73 surrounding a bounded region 75.

Wafer Division Step

As is the case with Embodiment 1, laser scribing is performed by radiating the laser beam 30 from the second main face 11b side along the first dividing lines 21 and the second dividing lines 22. This divides the wafer 10 to obtain a plurality of the light emitting elements 40. As shown in FIG. 19, the first dividing lines 21 and second dividing lines 22 are lines extending in a direction that intersects a line connecting the centers 75a of the bounded regions present around a single convex component 73. FIG. 19 is a plan view of an example of the relation between the first dividing lines 21 and second dividing lines 22 and the convex components 73 in Embodiment 2. In FIG. 19, the first dividing lines 21 and second dividing lines 22 are shown by thick lines, and a straight lines 62 by thin lines. In this example, the straight lines 62 connecting the centers 75a of the bounded regions extend in six directions. In FIG. 19, these six directions are shown as the straight lines 62 extending from a single center 75a. As shown in FIG. 19, the first dividing lines 21 and second dividing lines 22 are lines extending in a direction that intersects with all of the straight lines 62.

When the convex components 73 are in the form of circular cones or truncated circular cones, the places where light tends to concentrate are believed to be the portions defined by the virtual boundary between the numerous convex components 73, as is the case with Embodiment 1. However, the light emission intensity from the sapphire substrate 11 at the convex components 73 is substantially the same in every direction. Therefore, particularly when the convex components 73 are more tightly clustered in proportion to how much the shortest distance $d_1$ between the convex components 73 and the centers 75a of the bounded regions is less than the radius $d_2$ of the convex components 73, the light density will tend to be higher near the centers 75a of the bounded regions, and there is a tendency for damage to occur when the end of the semiconductor structure 12 coincides with the centers 75a of the bounded regions.

Figure 19:
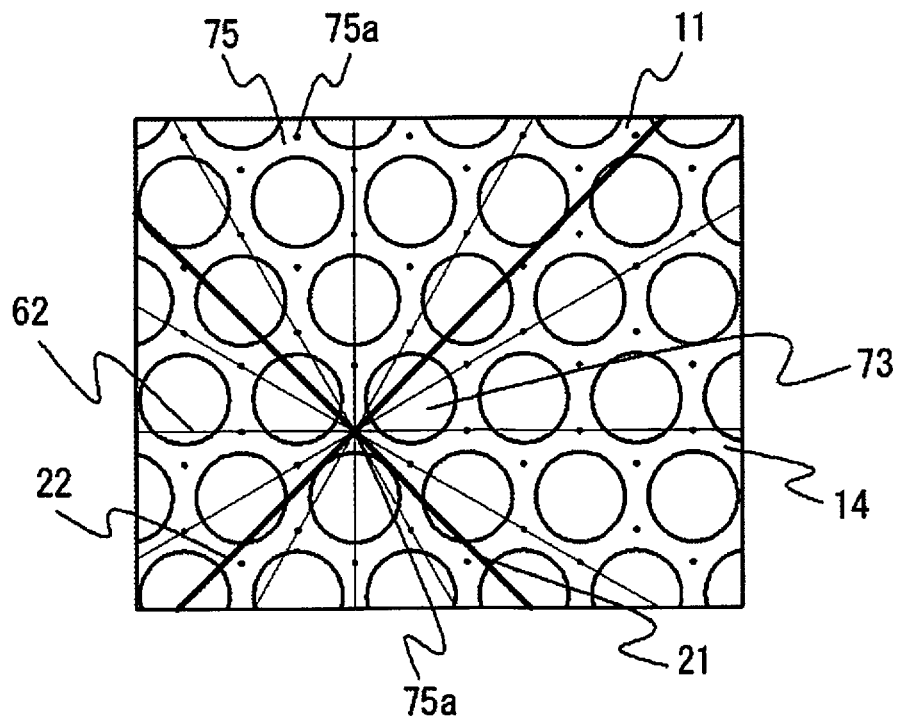
FIG. 19 is a plan view of an example of the relation between the convex components and the first dividing line and second dividing line in Embodiment 2.

In view of this, with the method for manufacturing a light emitting element in Embodiment 2, as shown in FIG. 19, the first dividing lines 21 and the second dividing lines 22 are set so as not to pass continuously through the centers 75a of the bounded regions 75 defined by the virtual boundary between the side faces of the convex components 73, and laser scribing is performed in this way. Consequently, it is less likely that damage to the semiconductor structure 12 will occur, and since any damage within a single light emitting element 40 will tend not to occur continuously, the yield can be boosted.

The size and layout of the convex components 73, the slope of the side faces, and so forth can be the same as those with the above-mentioned convex components 13. However, to make the distance $d_1$ less than the radius $d_2$ of the bottom faces of the convex components 73, a layout in the form of a triangle lattice, and especially a regular triangle lattice, is preferred. Also, the shortest distance $d_1$ from the convex components 13 to the centers 15a of the bounded regions is preferably no more than 10 μm, more preferably no more than 5 μm, and still more preferably no more than 1 μm. The lower limit to the distance $d_1$ may be such that the convex components 73 do not come into contact with each other. An example of the shortest distance between the convex components 73 (the width of the narrowest places of the valleys 14) is preferably about 0.2 to 5 μm, and more preferably about 0.5 to 5 μm.

What is claimed is:

1. A method for manufacturing a light emitting element, comprising steps of:

preparing a wafer that has a substrate with a first main face and a second main face, in which the first main face is provided with a plurality of convex components and valleys that connect the convex components, and a semiconductor structure that is provided on the first main face; and dividing the wafer by laser scribing, in which a laser beam is emitted from the second main face side along first dividing lines and second dividing lines, to obtain a plurality of light emitting elements; wherein the convex components are in the form of pyramids, prisms, or truncated pyramids, each of which having a polyhedral bottom face with a plurality of apexes, edge lines that extend from the apexes, and side faces that link the edge lines to each other, the convex components are disposed regularly so that a plurality of bounded regions, which are regions defined by virtual boundary between side faces of adjacent convex components in the valleys, are present around the convex components, and the first dividing lines and the second dividing lines are lines that extend in a direction that intersects straight lines that link the centers of the plurality of bounded regions around a single convex component.

2. The method for manufacturing the light emitting element of claim 1, wherein a shape of the bottom faces of the convex components is triangular, square, or hexagonal.

3. The method for manufacturing the light emitting element of claim 1, wherein the convex components are in the form of pyramids or truncated pyramids.

4. The method for manufacturing the light emitting element of claim 3, wherein two convex components that are adjacent at a shortest distance are arranged, in plan view, so that the side face of one convex component is located along an extension of the edge line of the other convex component.

5. The method for manufacturing the light emitting element of claim 1, wherein
a shortest distance between the convex components and the centers of the bounded regions is 10 μm or less.

6. The method for manufacturing the light emitting element of claim 1, wherein
the convex components are disposed at positions corresponding to points of a triangle lattice.

7. The method for manufacturing the light emitting element of claim 1, wherein
the side faces of the convex components are flat.

8. The method for manufacturing the light emitting element of claim 1, wherein
the first dividing lines and the second dividing lines are lines extending in a direction that intersects by at least one degree with the straight lines that connect the centers of the bounded regions around a single convex component.

9. The method for manufacturing the light emitting element of claim 1, wherein
the first dividing lines and the second dividing lines are lines extending in the same direction as a middle line that passes through a middle of two adjacent straight lines among the straight lines that connect the centers of the bounded regions around a single convex component, or lines extending in a direction that intersects the middle line by no more than five degrees.

10. The method for manufacturing the light emitting element of claim 1, wherein
the substrate is a sapphire substrate, and the semiconductor structure is a nitride semiconductor.

11. The method for manufacturing the light emitting element of claim 10, wherein
a thickness of the semiconductor structure is 3 μm to 20 μm.

* * * * *